United States Patent
Liu et al.

(10) Patent No.: US 12,011,909 B2
(45) Date of Patent: Jun. 18, 2024

(54) DISPLAY DEVICE

(71) Applicant: BOE TECHNOLOGY GROUP CO., LTD., Beijing (CN)

(72) Inventors: Junhuan Liu, Beijing (CN); Shangchieh Chu, Beijing (CN); Hong Zhu, Beijing (CN); Jiahao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 530 days.

(21) Appl. No.: 17/327,855

(22) Filed: May 24, 2021

(65) Prior Publication Data

US 2022/0063237 A1  Mar. 3, 2022

(30) Foreign Application Priority Data

Aug. 31, 2020 (CN) .......................... 202010900354.7

(51) Int. Cl.
| | |
|---|---|
| *B32B 3/28* | (2006.01) |
| *B32B 3/10* | (2006.01) |
| *B32B 7/12* | (2006.01) |
| *H10K 77/10* | (2023.01) |

(52) U.S. Cl.
CPC ................. *B32B 3/28* (2013.01); *B32B 3/10* (2013.01); *B32B 7/12* (2013.01); *B32B 2457/206* (2013.01); *H10K 77/111* (2023.02)

(58) Field of Classification Search
CPC .... B32B 3/28; B32B 3/10; B32B 7/12; B32B 2457/206; H10K 77/111
See application file for complete search history.

(56) References Cited

U.S. PATENT DOCUMENTS

2020/0315036 A1* 10/2020 Ahn .................... H05K 5/0017

\* cited by examiner

*Primary Examiner* — Alicia J Weydemeyer
*Assistant Examiner* — Laura B Figg
(74) *Attorney, Agent, or Firm* — XSENSUS LLP

(57) ABSTRACT

The present application provides a display device that includes a flexible display panel and a panel support device. The panel can be rolled up or stretched out along a first direction, and the support device includes an elastic member and movable members. The elastic member includes protrusion portions and groove portions alternately arranged along the first direction, the protrusion portion is fixed on a back surface of the panel, the groove portion and the back surface forms a strip-shaped cavity, and the width of the groove portion in an initial state gradually decreases along a direction approaching the panel. The movable members respectively and movably arranged in the cavities. When the movable member moves in the cavity, towards a side of the cavity close to the panel, the movable member supports and separates ends of two side walls of the groove portion close to the panel more apart.

19 Claims, 5 Drawing Sheets

DISPLAY DEVICE

CROSS-REFERENCE TO RELATED APPLICATION

This application is based upon, and claims the benefit of and priority to, Chinese Patent Application No. 202010900354.7, filed on Aug. 31, 2020, the entire contents thereof are incorporated herein by reference.

TECHNICAL FIELD

The present application relates to the field of display technology and, in particular, to a display device.

BACKGROUND

At present, flexible display panels usually use a hinge or a rigid shaft to realize the folding or curling thereof, but such structure has some defects. On one hand, the manufacturing technology of the hinge or rigid shaft is relatively difficult, resulting in a relatively high cost of the display device. On the other hand, the mechanical hinge may be damaged due to foreign objects entering thereinto and due to the dropping of the product, so the overall mechanical reliability is insufficient.

It should be noted that the information of the present application in the background section above is only used to enhance the understanding of the background of the present application and therefore, may include information that does not constitute the prior art known to those skilled in the art.

SUMMARY

The present application provides a display device.

According to an aspect of the present application, the display device includes a flexible display panel and a panel support device, where the flexible display panel is configured to be rolled up or stretched out along a first direction, and the panel support device includes:
  an elastic member, including a plurality of protrusion portions and a plurality of groove portions alternately arranged along the first direction, the protrusion portion and the groove portion both extending along a second direction and having a penetrating strip shape, the second direction being perpendicular to the first direction, the protrusion portion being fixed on a back surface of the flexible display panel, the groove portion and the back surface of the flexible display panel forming a strip-shaped cavity, and a width of the groove portion in an initial state gradually decreases along a direction approaching the flexible display panel; and
  a plurality of movable members, respectively and movably arranged in the cavities of the plurality of groove portions, the movable member extending in a strip shape along the second direction, and a width of the movable member in the first direction being greater than a minimum width of the groove portion in the initial state and being less than or equal to a maximum width of the groove portion in the initial state,
  wherein when at least one of the movable members moves, in the cavity, towards a side of the cavity close to the flexible display panel, the at least one of the movable members supports and separates ends of two side walls of the groove portion close to the flexible display panel more apart.

In an exemplary embodiment of the present application, a length of the movable member in the second direction is greater than a length of the elastic member in the second direction, and
  the display device further includes a guide assembly, configured to move along the first direction and be in contact with the at least one of the movable members, so as to:
  move the movable member from a side of the cavity away from the flexible display panel to the side of the cavity close to the flexible display panel, so that the movable member supports and separates the ends of the two side walls of the groove portion close to the flexible display panel more apart and makes the flexible display panel be stretched out; or
  move the movable member from the side of the cavity close to the flexible display panel to the side of the cavity away from the flexible display panel, so that the ends of the two side walls of the groove portion close to the flexible display panel become closer and the flexible display panel is rolled up.

In an exemplary embodiment of the present application, the guide assembly includes a first guide block and a second guide block, and the first guide block and the second guide block are disposed at an end of the movable member that extends to the outside of the elastic member,
  the first guide block includes a first arc-shaped guide surface with an opening that faces away from the flexible display panel, and when the first guide block moves along the first direction, the first arc-shaped guide contacts a surface of the movable member away from the flexible display panel to move the movable member from the side of the cavity away from the flexible display panel to the side of the cavity close to the flexible display panel, so that the movable member supports and separates the ends of the two side walls of the groove portion close to the flexible display panel more apart; and
  the second guide block includes a second arc-shaped guide surface with an opening that faces the flexible display panel, and when the second guide block moves along the first direction, the second arc-shaped guide surface contacts a surface of the movable member close to the flexible display panel, so as to move the movable member from the side of the cavity close to the flexible display panel to the side of the cavity away from the flexible display panel, so that the side of the groove portion close to the flexible display panel shrinks to the initial state.

In an exemplary embodiment of the present application, the first guide block and the second guide block are both semi-cylindrical.

In an exemplary embodiment of the present application, the first guide block and the second guide block of the guide assembly are both disposed at a same end of the elastic member.

In an exemplary embodiment of the present application, an inner wall of the groove portion of the elastic member is provided with a first limiting structure and a second limiting structure, the first limiting structure is disposed close to the flexible display panel, and the second limiting structure is disposed away from the flexible display panel;
  the first limiting structure is configured to limit the movable member in the cavity at the side of the cavity close to the flexible display panel, so that the movable member supports and separates the ends of the two side walls of the groove portion close to the flexible display panel more apart; and the second limiting structure is configured to limit the movable member in the cavity at the side of the cavity away from the flexible display panel, so that the side walls of the groove portion close to the flexible display panel shrinks to the initial state.

In an exemplary embodiment of the present application, the first limiting structure includes two first clamping slots, the two first clamping slots are respectively and correspondingly provided at positions of the two side walls of the groove portion close to the flexible display panel, and two opposite edges of the movable member can be stuck in the two first clamping slots; and the second limiting structure includes two second clamping slots, and the two second clamping slots are respectively and correspondingly provided at positions of the two side walls of the groove portion away from the flexible display panel, and the two opposite edges of the movable member can be stuck in the two second clamping slots.

In an exemplary embodiment of the present application, a point of the first arc-shaped guide surface that is closest to the flexible display panel is at a same straight line as the two first clamping slots, and a point of the second arc-shaped guide surface that is farthest from the flexible display panel is at a same straight line with the two second clamping slots.

In an exemplary embodiment of the present application, a distance between the first guide block and the second guide block in the guide assembly is less than or equal to the width of the movable member.

In an exemplary embodiment of the present application, both two ends of the movable member extend to the outside of the elastic member, and the display device includes two guide assemblies, the two guide assemblies are respectively disposed at the two ends of the movable member that extend to the outside of the elastic member, the first guide blocks in the two guide assemblies correspond to the same movable member, and can simultaneously move the movable member from the side of the cavity away from the flexible display panel to the side of the cavity close to the flexible display panel, and the second guide blocks in the two guide assemblies correspond to the same movable member, and can simultaneously move the movable member from the side of the cavity close to the flexible display panel to the side of the cavity away from the flexible display panel.

In an exemplary embodiment of the present application, the length of the elastic member in the second direction is smaller than a length of the flexible display panel in the second direction, and the length of the movable member in the second direction is less than or equal to the length of the flexible display panel in the second direction.

In an exemplary embodiment of the present application, the display device further includes a housing, the flexible display panel and the panel support device are both provided in the housing, and the panel support device is fixed to the housing, the flexible display panel is configured to be movable along the first direction, so that the first guide block moves the movable member from the side of the cavity away from the flexible display panel to the side of the cavity close to the flexible display panel, or the second guide block moves the movable member from the side of the cavity close to the flexible display panel to the side of the cavity away from the flexible display panel.

In an exemplary embodiment of the present application, the display device further includes a housing, and the flexible display panel and the panel support device are both provided in the housing;

the guide assembly further includes a connecting member, the connecting member connects the first guide block and the second guide block, and the connecting member is arranged on the housing to be movable along the first direction; and the connecting member moves along the first direction, so that the first guide block moves the movable member from the side of the cavity away from the flexible display panel to the side of the cavity close to the flexible display panel, or the second guide block moves the movable member from the side of the cavity close to the flexible display panel to the side of the cavity away from the flexible display panel.

In an exemplary embodiment of the present application, the housing is provided with a strip-shaped hole extending along the first direction, and the connecting member passes through the strip-shaped hole and is movable along the strip-shaped hole.

In an exemplary embodiment of the present application, the elastic member includes a material of steel, copper, beryllium bronze, natural rubber or thermoplastic polyurethane elastomer rubber.

In an exemplary embodiment of the present application, an adhesive layer is provided between the flexible display panel and the protrusion portion of the elastic member.

In an exemplary embodiment of the present application, the protrusion portion has a strip-shaped cavity that opens in a direction away from the flexible display panel, and the strip-shaped cavity of the protrusion portion and the strip-shaped cavity of the groove portion are alternately arranged in the first direction.

In an exemplary embodiment of the present application, the movable member has a strip-shaped thin plate structure.

In an exemplary embodiment of the present application, the two guide assemblies are connected to each other by a connecting shaft.

It should be understood that the above general description and the following detailed description are only exemplary and explanatory, which do not intend to limit the present application.

BRIEF DESCRIPTION OF THE DRAWINGS

The drawings here are incorporated into the specification and constitute a part of the specification, show embodiments that conform to the present application, and are used together with the specification to explain the principle of the present application. Understandably, the drawings in the following description are only some embodiments of the present application. For those skilled in the art, other drawings can be obtained based on these drawings without creative work.

DETAILED DESCRIPTION

Figure 1:
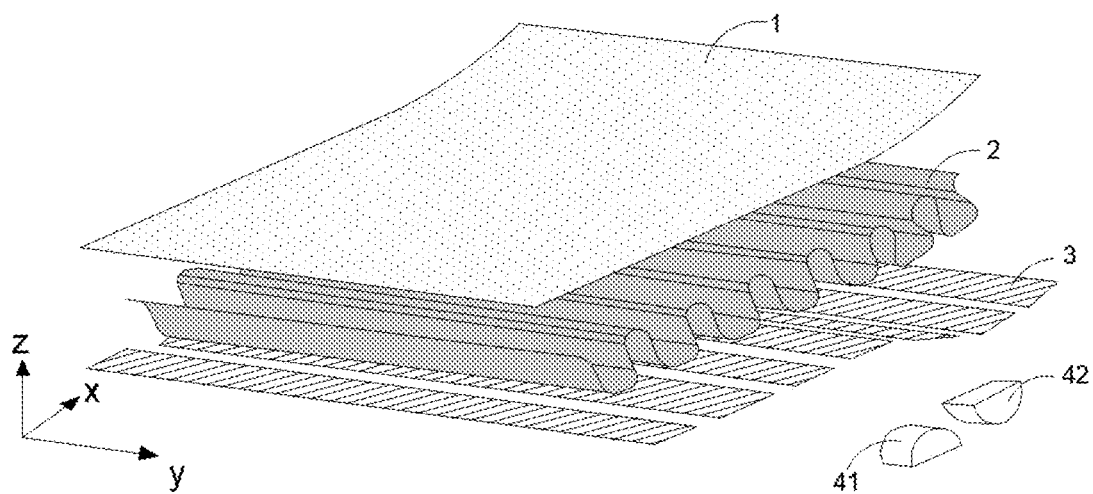
FIG. 1 is a schematic diagram of an exploded structure of a display device according to an embodiment of the present application.

Example embodiments will now be described more fully with reference to the accompanying drawings. However, the example embodiments can be implemented in various forms, and should not be construed as being limited to the embodiments set forth herein; on the contrary, these embodiments are provided so that the present application will be comprehensive and complete, and the concept of the example embodiments will be fully conveyed to those skilled in the art. The same reference numerals in the figures indicate the same or similar structures, and thus detailed descriptions thereof will be omitted.

Figure 2:
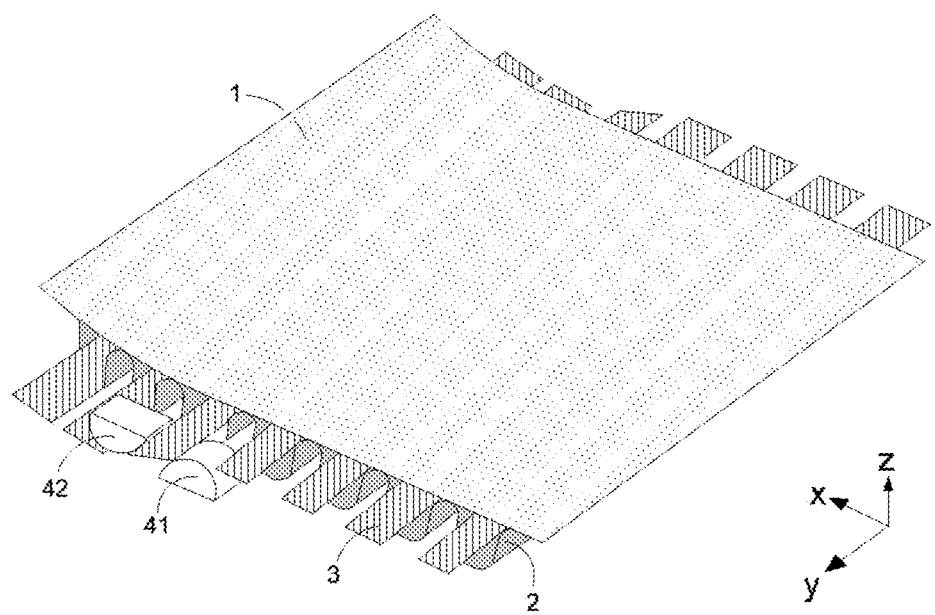
FIG. 2 is a three-dimensional structural diagram of a display device according to an embodiment of the present application.
Figure 3:
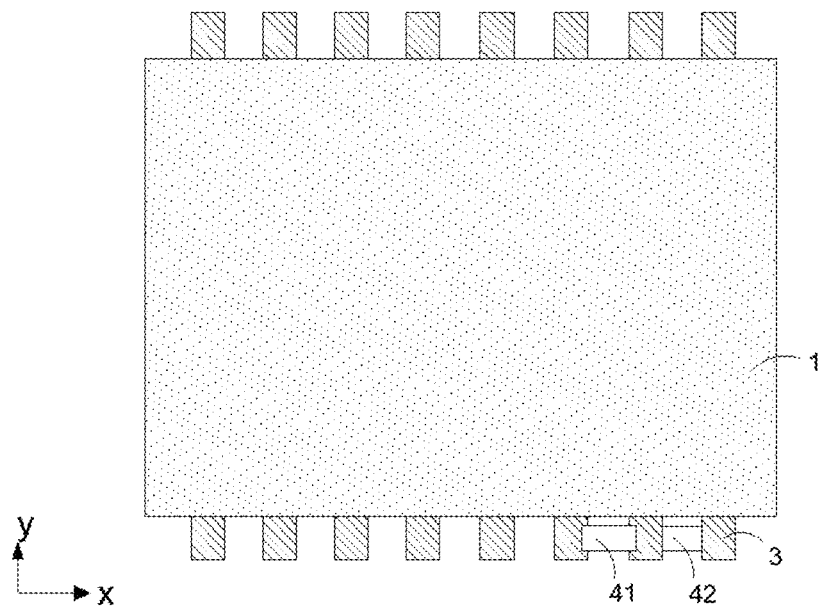
FIG. 3 is a top structural view of a display device according to an embodiment of the present application.

An embodiment of the present application provides a display device. Referring to FIGS. 1 to 3, the display device includes a flexible display panel 1 and a panel support device. The flexible display panel 1 is configured to be rolled up or stretched out in a first direction. The panel support device is configured to help the display panel 1 to be rolled up and stretched out, and includes an elastic member 2, a plurality of movable members 3, and a guide assembly. In the embodiment, the x direction as shown in the figure is taken as the first direction.

Figure 4:
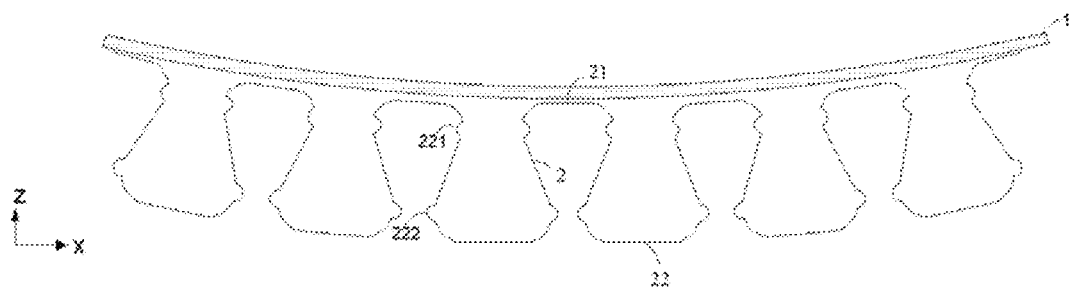
FIG. 4 is a schematic diagram of a cross-sectional structure of an elastic member and a display panel according to an embodiment of the present application.

The elastic member 2 as a whole looks like a flat plate with sawteeth. The elastic member 2 includes a plurality of protrusion portions 21 and a plurality of groove portions 22 alternately arranged along the first direction. The protrusion portion 21 and the groove portion 22 both extend in a second direction and have a penetrating strip shape. The second direction is perpendicular to the first direction, that is, the second direction is the y direction shown in the figure. FIG. 4 is a schematic cross-sectional view of the elastic member 2 in the x direction. The cross-sectional shape of the elastic member 2 is similar to sawteeth, and the protrusion portions 21 and the groove portions 22 are alternately arranged. The elastic member 2 as a whole is disposed on a back surface of the display panel 1, the protrusion portion 21 of the elastic member 2 is fixed to the back surface of the display panel 1, and the groove portion 22 and the back surface of the display panel 1 form a strip-shaped cavity. The elastic member 2 is made of an elastic material. In an initial state, a width of the groove portion 22 gradually decreases in a direction approaching the display panel 1, that is, the groove portion 22 is wide at the bottom and narrow at the top as shown in the figure. Therefore, in the absence of an external force, a side of the entire elastic member 2 close to the display panel 1 shrinks relative to a side thereof away from the display panel 1, so that the elastic member 2 is rolled up. Since the protrusion portion 21 between every two groove portions 22 is fixed on the back surface of the display panel 1, the rolling up of the elastic member 2 will drive the flexible display panel 1 to be rolled up to achieve folding or bending of the display panel 1.

Figure 5:
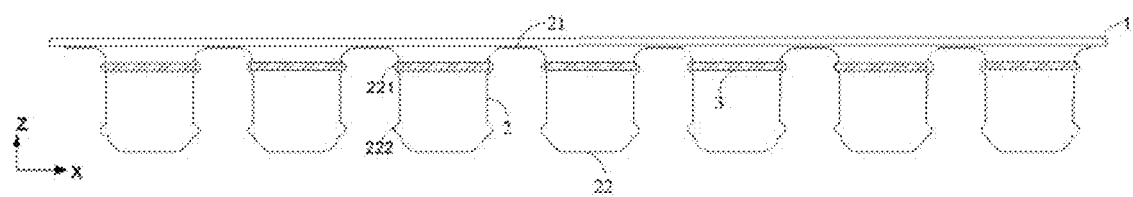
FIG. 5 is a schematic diagram of a cross-sectional structure of a display panel when being stretched out according to the embodiment of the present application.
Figure 6:
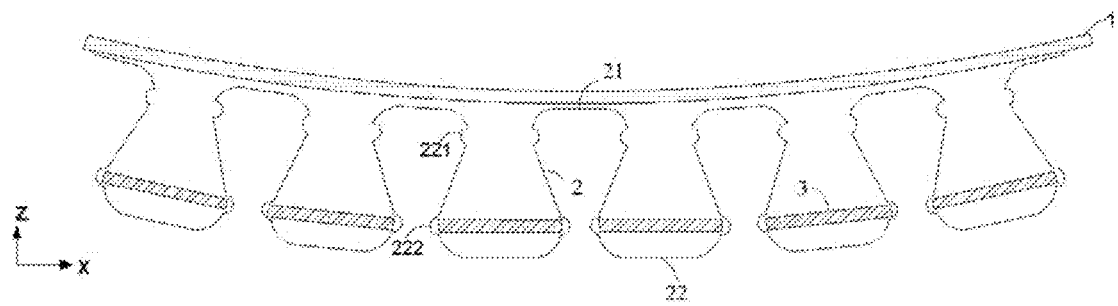
FIG. 6 is a schematic diagram of a cross-sectional structure of an display panel when being rolled up according to the embodiment of the present application.

As shown in FIGS. 1-3, the movable member 3 extends in a strip shape in the y direction, and the plurality of movable members 3 are respectively and movably arranged in the cavities of the plurality of groove portions 22. The movable member 3 may be a shape of a long plate as shown in the figure. The dimension of the movable member 3 in the x direction is taken as the width thereof and the dimension of the movable member 3 in the y direction is taken as the length thereof. The length of the movable member 3 in the y direction is greater than that of the elastic member 2 in the y direction. That is, at least one end of the movable member 3 extends to the outside of the groove portion 22. Referring to FIG. 5, the width of the movable member 3 in the x direction is greater than a minimum width of the groove portion 22 in the initial state, that is, when all the movable members 3 are located in upper parts of the cavities, upper ends of two side walls of the groove portion 22 can be supported and separated more apart by the movable member 3, i.e., the upper ends of the two side walls of the groove portion 22 are opened by an external force, so that the side of the entire elastic member 2 close to the display panel 1 is stretched out. It can be understood that the greater the width of the movable member 3, the greater the separated width between the upper ends of the two side walls of the groove 22, and the flatter the display panel 1 will be. Understandably, when the movable member 3 separates the upper ends of the two side walls of the groove portion 22 apart to have the same width therebetween as that between the lower ends of the two side walls, the entire elastic member 2 is stretched out in a flat state, and at the same time, the display panel 1 is also stretched out into a plane. Since the width of the movable member 3 is less than or equal to the maximum width of the lower part of the groove portion 22 in the initial state, when all the movable parts 3 are located in lower parts of the cavities, the upper ends of the groove portion 22 do not have the force from the movable member 3 and thus, return to the initial smaller width therebetween by means of the elasticity of the groove portion 22. Therefore, the upper side of the entire elastic member 2 shrinks to be rolled up, as shown in FIG. 6. It can be seen that the upper and lower positions of the movable member 3 in the cavity determine the different forms of the elastic member 2 and thus, the different forms of the display panel 1.

The guide assembly is configured to control the movable member 3 to move up and down in the cavity, that is, to move in the z direction, so that the elastic member 2 can drive the flexible display panel 1 to form different shapes. The guide assembly is configured to move in the first direction relative to the elastic member 2 and be in contact with at least one of the movable members 3 to move the movable member 3 from a side of the cavity away from the display panel 1 to the side of the cavity close to the display panel 1, i.e., from the lower part of the cavity to the upper part of the cavity, so that the movable member 3 supports and separates the upper ends of the two side walls of the groove portion 22 more apart and makes the display panel 1 be stretched out. The guide assembly is also configured to move in the first direction relative to the elastic member 2 and be in contact with the at least one of the movable members 3 to move the movable member 3 from the side of cavity close to the display panel 1 to the side of the cavity away from the display panel 1, so that the side of the groove 22 close to the display panel 1 shrinks and the display panel 1 is rolled up.

The panel support device of the present application achieves stretching out or rolling up by means of the elastic deformation of the elastic member 2, thereby driving the display panel 1 to be stretched out or rolled up. Compared with various mechanical structures, such as a hinge or a rigid shaft, the panel support device has a simple structure and a lower processing difficulty and thus, the cost of the entire display device is reduced. Moreover, the elastic member 2 is a whole-surface elastic structure, which is not easy to be damaged and has high mechanical reliability. In addition, the guide assembly and the movable member 3 have a simple structure, are easy to cooperate with each other, occupy a small space, and thus, have strong practicability.

The display device according to an embodiment of the present application will be described in detail below.

In the present application, the elasticity of the elastic member 2 affects the recovery ability of the deformation of the elastic member 2, and further affects the fully stretched state of the display panel 1. It can be understood that the greater the elasticity of the elastic member 2 is, the stronger the recovery ability to the curled shape after the external force is removed, and the greater the angle at which the display panel 1 is bent or folded. Therefore, the elastic member 2 may be made of a metal or non-metal material with greater elasticity, such as steel, copper, beryllium bronze, natural rubber, thermoplastic polyurethane elastomer rubber, and the like.

Referring to FIG. 4, the cross-sectional shape of the elastic member 2 in the initial state in the embodiment is shown. The protrusion portion 21 opens downward and both sides thereof are gradually retracted inward. The groove portion 22 opens upward and both sides thereof are gradually retracted inward. The plurality of protrusion portions 21 and the plurality of groove portions 22 are formed into the zigzag elastic member 2. The parameters, such as angle, and dimensions as shown are only an example. When the parameters change, the cross-sectional shape of the protrusion portion 21 and the groove portion 22 may also be of other shapes, which will not be repeated here. In the embodiment, the elastic member 2 may be integrally formed by mechanical means such as punching press. In the embodiment, an adhesive layer (not shown) may be provided between the protrusion portion 21 and the flexible display panel 1 to bond the elastic member 2 and the flexible display panel 1 together, which has less effect on the display effect and bending ability of the display panel 1. However in other embodiments, the elastic member 2 and the flexible display panel 1 can also be fixed by other mechanical means.

In the present application, the material of the movable member 3 may be metal, plastic, ceramic, and the like with large rigidity, which thus can provide a stable support force to the groove portion 22 of the elastic member 2, so that the groove portion 22 can be maintained stability in an unfolded state. As shown in FIGS. 1 and 2, the movable member 3 in the embodiment is a strip-shaped thin plate structure, and has a width greater than a minimum width between the two side walls of the groove portion 22 in the initial state and equal to a maximum width between the two side walls. When the movable member 3 is moved to the upper side of the cavity of the groove portion 22 by the guide assembly, the movable member 3 is placed horizontally with both edges against the inner wall of the groove portion 22 to support and separate the two side walls of the groove portion 22 to have a same width therebetween as the maximum width, and at this time, the display panel 1 is fully stretched out and is flat. When the movable member 3 is moved to the lower side of the cavity of the groove portion 22 by the guide assembly, the movable member 3 is located at the widest width of the groove portion 22.

Figure 7:
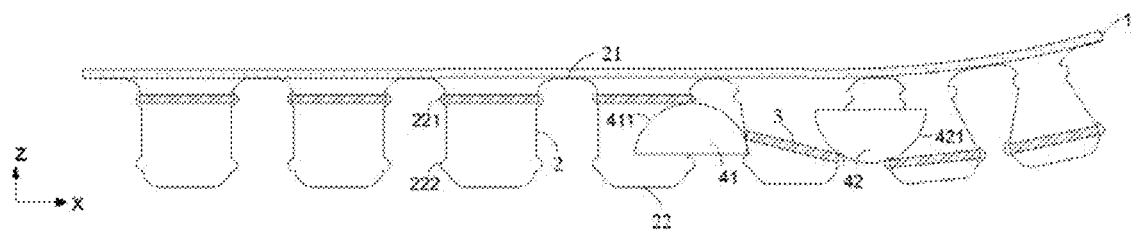
FIG. 7 is a schematic diagram of the working principle of a panel support device according to an embodiment of the present application.

As shown in FIG. 7, the guide assembly includes a first guide block 41 and a second guide block 42, and the first guide block 41 and the second guide block 42 are disposed at an end of the movable member 3 that extends to the outside of the groove portion 22. The first guide block 41 is configured to move in the first direction relative to the elastic member 2 and be in contact with at least one of the movable members 3, so as to move the movable member 3 from the side of the cavity away from the display panel 1 to the side of the cavity close to the display panel 1, that is, from the lower side of the cavity to the upper side of the cavity, so that the movable member 3 supports and separates the upper ends of the two side walls of the groove portion 22 more apart and makes the display panel 1 be stretched out. The second guide block 42 is configured to move in the first direction relative to the elastic member 2 and be in contact with at least one of the movable members 3, so as to move the movable member 3 from the side of the cavity close to the display panel 1 to the side of the cavity away from the display panel 1, so that the side of the groove portion 22 close to the display panel 1 shrinks and the display panel 1 is rolled up. By taking the direction indicated by the arrow shown as an example, the first guide block 41 moves to the right along the x direction, and sequentially pushes one by one the movable members 3 in the lower parts of the cavities to the upper parts of the cavities, so that the elastic member 2, which is rolled up originally, is stretched out in sequence from the left to the right, and finally the flexible display panel 1 is stretched out. The second guide block 42 moves to the left along the x direction, and sequentially presses one by one the movable members 3 in the upper parts of the cavities down to the lower parts of the cavities, so that the elastic member 2, which is stretched out originally, gradually shrinks and rolls up from the right to the left, and finally the flexible display panel 1 is rolled up.

Referring to FIGS. 4 to 7, in an embodiment of the present application, the inner wall of the groove portion 22 of the elastic member 2 is provided with a first limiting structure and a second limiting structure in order to stabilize the position of the movable member 3 in the cavity of the groove portion 22. The first limiting structure is disposed close to the display panel 1, and the second limiting structure is disposed far away from the display panel 1. The first limiting structure is configured to limit the movable member 3 in the cavity at the side of the cavity close to the display panel 1, so that the movable member 3 supports and separates the two side walls of the groove portion 22 close to the display panel 1 more apart. The second limiting structure is configured to limit the movable member 3 in the cavity at the side of the cavity away from the display panel 1, so that the side walls of the groove portion 22 close to the display panel 1 shrinks to the initial state.

In an embodiment, the first limiting structure includes two first clamping slots 221, the two first clamping slots 221 are respectively and correspondingly provided at upper positions of the two side walls of the groove portion 22, and two opposite edges of the movable member 3 can be stuck in the two first clamping slots 221 to be stabilized at the position and support and separate the two side walls of the groove portion 22 close to the display panel 1 more apart. The second limiting structure includes two second clamping slots 222, the two second clamping slots 222 are respectively and correspondingly provided at lower positions of the two side walls of the groove portion 22, and two opposite edges of the movable member 3 can be stuck in the two second clamping slots 222 to be stabilized at the position. In an embodiment of the present application, the side walls of the groove portion 22 may be directly punched outward to form the clamping slots protruding from the side wall as shown.

In the present application, FIGS. 1, 2, and 7 show an exemplary structural diagram of the first guide block 41. The first guide block 41 includes a first arc-shaped guide surface 411 with an opening that faces downwards. When the first guide block 41 moves relative to the elastic member 2 from the left to the right, the first arc-shaped guide surface 411 can contact a lower surface of the movable member 3, and thus move the movable member 3 in the second clamping slots 222 from the lower part of the cavity to the upper part of the cavity, until the movable member 3 is stuck in the first clamping slots 221. Therefore, the highest point of the first arc-shaped guide surface 411, that is, the point position closest to the display panel 1, is at a same straight line with the positions of the two first clamping slots 221.

The second guide block 42 includes a second arc-shaped guide surface 421 with an opening that faces upwards. When the second guide block 42 moves relative to the elastic member 2 from the right to the left, the second arc-shaped guide surface 411 can contact an upper surface of the movable member 3, and thus move the movable member 3 in the first clamping slots 221 from the upper part of the cavity to the lower part of the cavity, until the movable member 3 is stuck in the second clamping slots 222. Therefore, the lowest point of the second arc-shaped guide surface 421, that is, the point position farthest from the display panel 1, is at a same straight line with the positions of the two second clamping slots 222.

In an exemplary embodiment, as shown in FIG. 7, the first guide block 41 and the second guide block 42 are both semi-cylindrical, and the two semi-cylinders are placed in opposite directions, so that the arc-shaped surface of one semi-cylinder opens downward, and the arc-shaped surface of the other semi-cylinder opens upward. In an embodiment, the dimensions of the first guide block 41 and the second guide block 42 are equal, and the arc-shaped surface of each guide block only contacts one movable member 3 at a time. In another embodiment, the curvatures of the first arc-shaped guide surface 411 and the second arc-shaped guide surface 421 and the dimensions thereof along the x direction may be larger, so that they can simultaneously contact a plurality of movable members 3, and during relative movement, can simultaneously change the positions of the plurality of movable members 3.

In an embodiment, as shown in FIG. 7, the distance between the first guide block 41 and the second guide block 42 in the guide assembly is smaller than the width of the movable part 3, that is, at most one movable member 3 can be accommodated between the first guide block 41 and the second guide block. When the first guide block 41 and the second guide block 42 simultaneously move to the leftmost or rightmost end relative to the elastic member 2, all the movable members 3 at both ends can be pushed upward or pressed downward. If the distance between the first guide block 41 and the second guide block 42 is too large, one of the guide blocks cannot contact the movable member 3 on the outermost side, and thus the movable member 3 on the edge cannot be pushed upward or pressed downward, so that the display panel 1 cannot be fully stretched out or rolled up.

Figure 10:
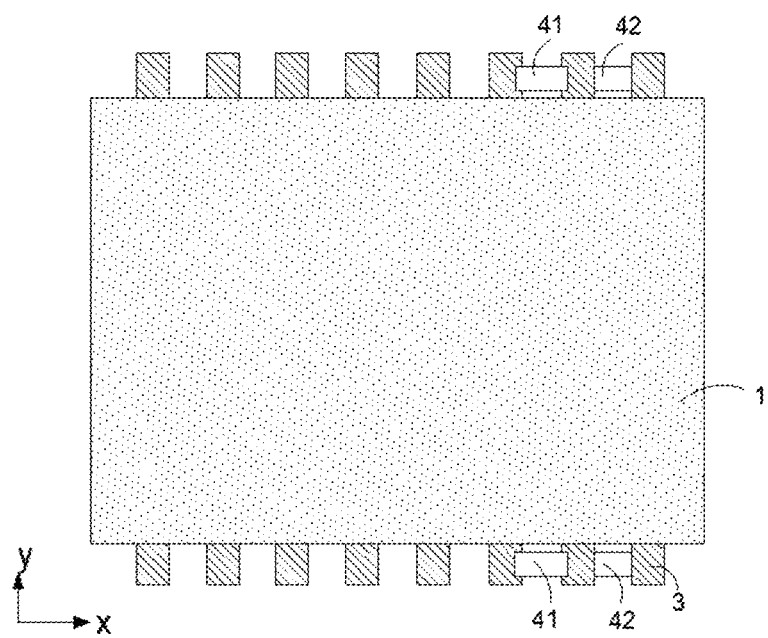
FIG. 10 is another top view of a structure of a display device according to an embodiment of the present application.

In the display device shown in FIGS. 1 to 3, only one guide assembly is included, and the two guide blocks of the one guide assembly are both disposed at the same end of the elastic member 2. In order that the guide assembly can control the moving position of the movable member 3 more stably, in an exemplary embodiment, referring to FIG. 10, two guide assemblies are included, and the two guide assemblies are disposed on two ends of the elastic member 2 respectively. In other words, both ends of the movable member 3 extend to the outside of the elastic member 2, and each of the two ends of the movable member 3 is provided with one guide assembly. Two first guide blocks 41 of the two guide assemblies correspond to the same movable member 3 and can simultaneously move the movable member 3 from the lower part of the cavity to the upper part of the cavity. Two second guide blocks 42 of the two guide assemblies correspond to the same movable member 3 and can simultaneously move the movable member 3 from the upper part of the cavity to the lower part of the cavity. In this way, both ends of the movable member 3 can be simultaneously pushed upward or pressed downward, ensuring that the entire movable member 3 can smoothly enter into the first clamping slots 221 or the second clamping slots 222. It can be understood that if the two guide assemblies need to move synchronously, then the two guide assemblies can be connected through a connecting shaft for control, or can be manually operated synchronously for control, which will not be repeated here.

Figure 11:
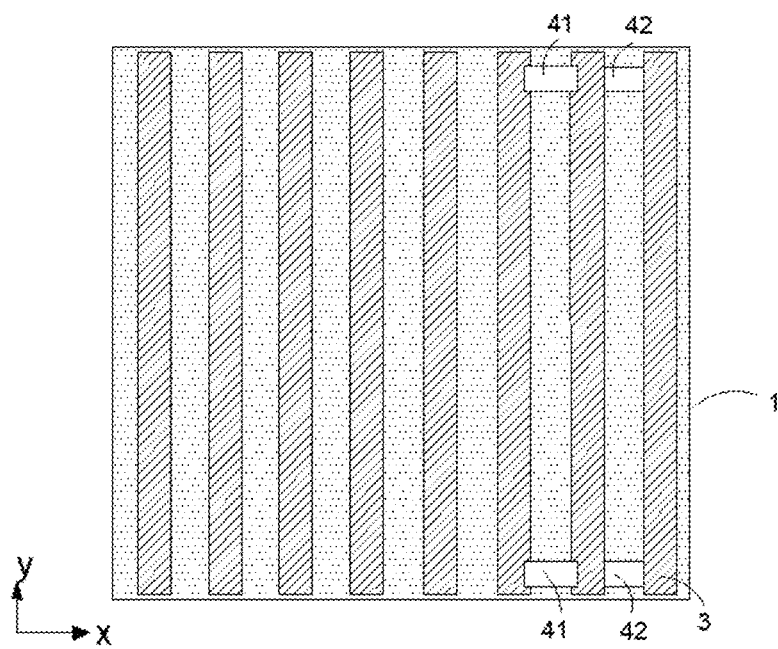
FIG. 11 is a bottom view of a structure of a movable member and a display panel according to an embodiment of the present application.

In the embodiment described in FIGS. 1-3, the length of the elastic member 2 in the second direction is equal to the length of the display panel 1 in the second direction. Therefore, the movable member 3 extends out of both ends of the display panel 1, and the guide assembly is also provided at outside of the display panel 1, which thus occupies a lot of space at the outside of the display panel 1, and is difficult to realize a narrow frame design. To solve this problem, in an exemplary embodiment, the length of the elastic member 2 in the second direction is less than the length of the display panel 1 in the second direction, and the length of the movable member 3 in the second direction is less than or equal to the length of the display panel 1 in the second direction, as shown in FIG. 11. In such structure, the entire guide assembly can be arranged under the display panel 1, which does not need to occupy the space outside the display panel 1, and thus facilitates the realization of the narrow frame design. At the same time, although the area of the elastic member 2 becomes smaller, it does not affect the control of the state of the display panel 1.

In the present application, the flexible display panel and the guide assembly move relative to each other, and thus can achieve the stretching out or roll up of the flexible display panel. Then, it may be the flexible display panel or the guide assembly that actually moves.

Figure 8:
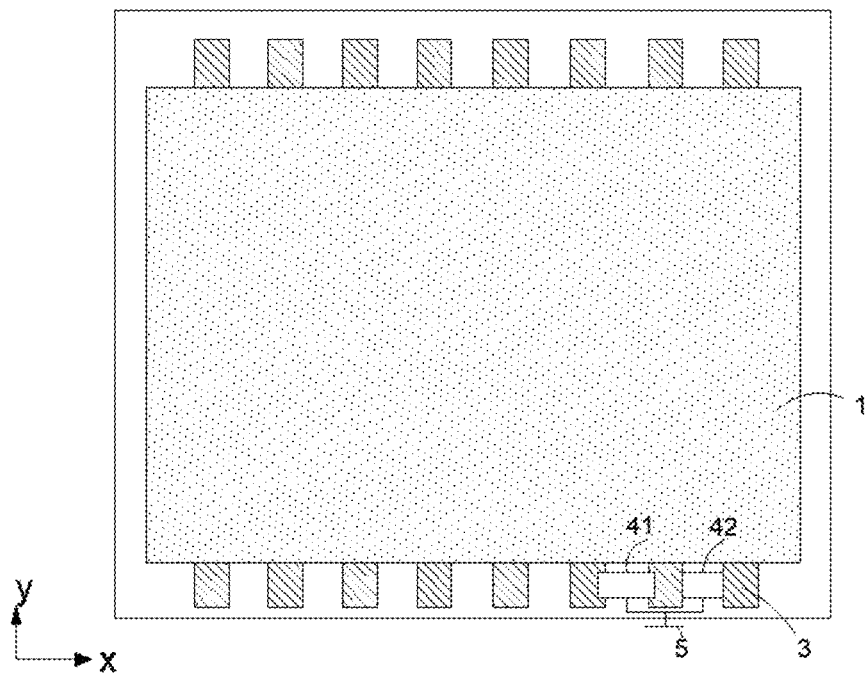
FIG. 8 is a top view of a structure with a housing according to an embodiment of the present application.

In an embodiment, as shown in FIG. 8, the display device further includes a housing 6. The flexible display panel and the panel support device are both provided in the housing 6. The first guide block 41 and the second guide block 42 are mounted on the housing 6, and can move in the first direction.

Figure 9:
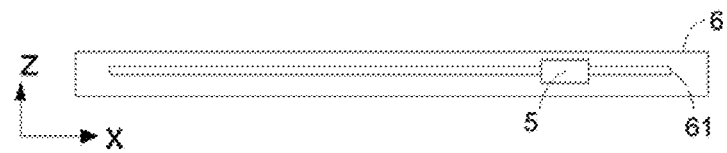
FIG. 9 is a structural side view of a housing according to an embodiment of the present application.

In order to simplify the operation of the guide block, in an embodiment shown in FIG. 8, the first guide block 41 and the second guide block 42 are connected together by a connecting member 5. The connecting member 5 can be arranged on the housing 6 and can move in the first direction, so that the connecting member 5 can be moved to drive the two guide blocks to move. Referring to FIGS. 8 and 9, an exemplary embodiment of the connecting member 5 is shown. The housing 6 is provided with a strip-shaped hole 61 extending in the first direction, and the connecting member 5 passes through the strip-shaped hole 61 to be fixed with the two guide blocks. The connecting member 5 can be moved along the strip-shaped hole 61 to drive the two guide blocks to move, thereby realizing the stretching out or rolling up of the display panel 1. Since the highest point of the first guide block 41 is not higher than the movable member 3, and the lowest point of the second guide block 42 is not lower than the movable member 3, the first and second guide blocks 41 and 42 will not interfere with each other when moving at the same time, so that the shape of the display panel 1 can be easily and quickly controlled. However in other embodiments, the first guide block 41 and the second guide block 42 can also be controlled separately without being connected to each other, which will not be described in detail here.

In another embodiment, the display device includes a housing, the flexible display panel and the panel support device are both provided in the housing, and the first guide block 41 and the second guide block 42 are fixedly mounted on the housing. The flexible display panel is configured to be movable in the x direction, that is, be movable relative to the guide assembly, so that the first guide block 41 can move the movable member from the lower part of the cavity to the upper part of the cavity, or the second guide block 42 can move the movable member from the upper part of the cavity to the lower part of the cavity. With such structure being used, the flexible display panel can be directly pulled to be rolled up or stretched out.

In addition, regardless of the above-mentioned structure, a stop structure can be provided at both ends of the elastic member, so that the flexible display panel and the guide block can be stopped when moving to the end.

It should also be noted that the flexible display panel 1 of the present application may be an OLED flexible display panel, or a quantum dot flexible display panel. As long as the flexible display panel is bendable or foldable, it can be rolled up or stretched out by the aforementioned panel support device.

Although relative terms such as "upper" and "lower" are used in the specification to describe the relative relationship between one component and another component shown, these terms are used in the specification only for facilitating description, for example, according to the example direction shown in the drawings. It shall be understood that if a device shown is turned upside down, the component described as "upper" will become the "lower" component. When a structure is "on" other structure, it may mean that the structure is integrally formed on the other structure, or that the structure is "directly" disposed on the other structure, or that the structure is "indirectly" disposed on the other structure with another structure therebetween.

The terms "a", "an", "the", "said", and "at least one" are used to indicate the presence of one or more elements/components/etc. The terms "including" and "have" are used to indicate open-ended inclusion and means that there may be additional elements, components, etc. in addition to the listed elements, components, etc.

Those skilled in the art will easily think of other embodiments of the present application after considering the specification and practicing the invention disclosed herein. The present application is intended to cover any variations, uses, or adaptive changes of the present application. These variations, uses, or adaptive changes follow the general principles of the present application and include the common knowledge or customary technical means in the technical field that are not disclosed in the present application. The description and embodiments are only regarded as exemplary, and the true scope and spirit of the present application are limited by the appended claims.

What is claimed is:

1. A display device, comprising:
a flexible display panel and a panel support device, wherein the flexible display panel is configured to be rolled up or stretched out along a first direction, and the panel support device comprises:
an elastic member comprising a plurality of protrusion portions and a plurality of groove portions alternately arranged along the first direction, the protrusion portion and the groove portion both extending along a second direction and having a penetrating strip shape, the second direction being perpendicular to the first direction, the protrusion portion being fixed on a back surface of the flexible display panel, each groove portion having two side walls and a bottom wall connecting the two side walls, the two side walls and the bottom wall of the groove portion and the back surface of the flexible display panel defining a cavity of a strip-shape, and a width of the groove portion in an initial state gradually decreases along a direction approaching the flexible display panel; and
a plurality of movable members respectively and movably arranged in the cavities of the plurality of groove portions, the movable member extending in a strip shape along the second direction, and a width of the movable member in the first direction being greater than a minimum width of the groove portion in the initial state and being less than or equal to a maximum width of the groove portion in the initial state,
wherein when at least one of the movable members moves, in the cavity, towards a side of the cavity close to the flexible display panel, ends of the two side walls of the groove portion close to the flexible display panel are moved away from each other by insertion of the moveable member.

2. The display device according to claim 1, wherein:
a length of the movable member in the second direction is greater than a length of the elastic member in the second direction, and
the display device further comprises a guide assembly, configured to move along the first direction and be in contact with the at least one of the movable members, so as to:
move the movable member from a side of the cavity away from the flexible display panel to the side of the cavity close to the flexible display panel, so that the movable member makes the ends of the two side walls of the groove portion close to the flexible display panel be moved away from each other and makes the flexible display panel be stretched out; or
move the movable member from the side of the cavity close to the flexible display panel to the side of the cavity away from the flexible display panel, so that the ends of the two side walls of the groove portion close to the flexible display panel are moved close to each other and the flexible display panel is rolled up.

3. The display device according to claim 2, wherein:
the guide assembly comprises a first guide block and a second guide block, and the first guide block and the second guide block are disposed at an end of the movable member that extends beyond the elastic member in the second direction;

the first guide block comprises a first arc-shaped guide surface with an opening that faces away from the flexible display panel, and when the first guide block moves along the first direction, the first arc-shaped guide surface contacts a surface of the movable member away from the flexible display panel to move the movable member from the side of the cavity away from the flexible display panel to the side of the cavity close to the flexible display panel, so that the movable member makes the ends of the two side walls of the groove portion close to the flexible display panel be moved away from each other; and the second guide block comprises a second arc-shaped guide surface with an opening that faces the flexible display panel, and when the second guide block moves along the first direction, the second arc-shaped guide surface contacts a surface of the movable member close to the flexible display panel, so as to move the movable member from the side of the cavity close to the flexible display panel to the side of the cavity away from the flexible display panel, so that the side of the groove portion close to the flexible display panel shrinks to the initial state.

4. The display device according to claim 3, wherein the first guide block and the second guide block are both semi-cylindrical.

5. The display device according to claim 4, wherein the first guide block and the second guide block of the guide assembly are both disposed at a same end of the elastic member.

6. The display device according to claim 3, wherein:
an inner wall of the groove portion of the elastic member is provided with a first limiting structure and a second limiting structure, the first limiting structure is disposed close to the flexible display panel, and the second limiting structure is disposed away from the flexible display panel;

the first limiting structure is configured to limit the movable member in the cavity at the side of the cavity close to the flexible display panel, so that the movable member makes the ends of the two side walls of the groove portion close to the flexible display panel be moved away from each other; and the second limiting structure is configured to limit the movable member in the cavity at the side of the cavity away from the flexible display panel, so that the side walls of the groove portion close to the flexible display panel shrinks to the initial state.

7. The display device according to claim 6, wherein:
the first limiting structure comprises two first clamping slots, the two first clamping slots are respectively and correspondingly provided at positions of the two side walls of the groove portion close to the flexible display panel, and two opposite edges of the movable member can be stuck in the two first clamping slots; and the second limiting structure comprises two second clamping slots, and the two second clamping slots are respectively and correspondingly provided at positions of the two side walls of the groove portion away from the flexible display panel, and the two opposite edges of the movable member can be stuck in the two second clamping slots.

8. The display device according to claim 7, wherein a point of the first arc-shaped guide surface that is closest to the flexible display panel is at a same straight line as the two first clamping slots, and a point of the second arc-shaped guide surface that is farthest from the flexible display panel is at a same straight line with the two second clamping slots.

9. The display device according to claim 3, wherein a distance between the first guide block and the second guide block in the guide assembly is less than or equal to the width of the movable member.

10. The display device according to claim 3, wherein:
both two ends of the movable member extend beyond the elastic member in the second direction, and the display device comprises two guide assemblies;

the two guide assemblies are respectively disposed at the two ends of the movable member that extend beyond the elastic member in the second direction;

the first guide blocks in the two guide assemblies correspond to the same movable member, and can simultaneously move the movable member from the side of the cavity away from the flexible display panel to the side of the cavity close to the flexible display panel; and the second guide blocks in the two guide assemblies correspond to the same movable member, and can simultaneously move the movable member from the side of the cavity close to the flexible display panel to the side of the cavity away from the flexible display panel.

11. The display device according to claim 3, wherein the length of the elastic member in the second direction is smaller than a length of the flexible display panel in the second direction, and the length of the movable member in the second direction is less than or equal to the length of the flexible display panel in the second direction.

12. The display device according to claim 3, wherein:
the display device further comprises a housing, the flexible display panel and the panel support device are both provided in the housing, and the panel support device is fixed to the housing; and the flexible display panel is configured to be movable along the first direction, so that the first guide block moves the movable member from the side of the cavity away from the flexible display panel to the side of the cavity close to the flexible display panel, or the second guide block moves the movable member from the side of the cavity close to the flexible display panel to the side of the cavity away from the flexible display panel.

13. The display device according to claim 3, wherein:
the display device further comprises a housing, and the flexible display panel and the panel support device are both provided in the housing;

the guide assembly further comprises a connecting member, the connecting member connects the first guide block and the second guide block, and the connecting member is arranged on the housing to be movable along the first direction; and the connecting member moves along the first direction, so that the first guide block moves the movable member from the side of the cavity away from the flexible display panel to the side of the cavity close to the flexible display panel, or the second guide block moves the movable member from the side of the cavity close to the flexible display panel to the side of the cavity away from the flexible display panel.

14. The display device according to claim 13, wherein the housing is provided with a strip-shaped hole extending along the first direction, and the connecting member passes through the strip-shaped hole and is movable along the strip-shaped hole.

15. The display device according to claim 1, wherein the elastic member comprises a material of steel, copper, beryllium bronze, natural rubber or thermoplastic polyurethane elastomer rubber.

16. The display device according to claim 1, wherein an adhesive layer is provided between the flexible display panel and the protrusion portion of the elastic member.

17. The display device according to claim 1, wherein the protrusion portion has two side walls and a bottom wall connecting the two side walls of the protrusion portion, the two side walls and the bottom wall of the protrusion portion define a cavity of a strip-shape that opens in a direction away from the flexible display panel, and the cavity defined by the protrusion portion and the cavity defined by the groove portion are alternately arranged in the first direction.

18. The display device according to claim 1, wherein the movable member has a strip-shaped thin plate structure.

19. The display device according to claim 10, wherein the two guide assemblies are connected to each other by a connecting shaft.

\* \* \* \* \*